United States Patent [19]

Winston

[11] 4,114,592
[45] Sep. 19, 1978

[54] CYLINDRICAL RADIANT ENERGY DIRECTION DEVICE WITH REFRACTIVE MEDIUM

[75] Inventor: Roland Winston, Chicago, Ill.

[73] Assignee: The United States of America as represented by the United States Department of Energy, Washington, D.C.

[21] Appl. No.: 714,863

[22] Filed: Aug. 16, 1976

[51] Int. Cl.² ............................ F24J 3/02; G02B 5/10; G02B 5/14

[52] U.S. Cl. .................................. 126/270; 136/89 PC; 250/227; 350/96.10; 350/96.31; 350/293

[58] Field of Search ................ 126/270, 271; 250/227; 350/96 R, 96 EN, 293, 96.10, 96.31; 136/89 PC, 206

[56] References Cited

U.S. PATENT DOCUMENTS 4,029,519   6/1977   Schertz et al. .................... 126/270 X

FOREIGN PATENT DOCUMENTS 1,472,267   12/1969   Fed. Rep. of Germany ........... 350/293

Primary Examiner—F. L. Evans
Attorney, Agent, or Firm—Dean E. Carlson; Frank H. Jackson; Paul A. Gottlieb

[57] ABSTRACT

A device is provided for directing radiant energy and includes a refractive element and a reflective boundary. The reflective boundary is so contoured that incident energy directed thereto by the refractive element is directed to the exit surface thereof or onto the surface of an energy absorber positioned at the exit surface.

15 Claims, 7 Drawing Figures

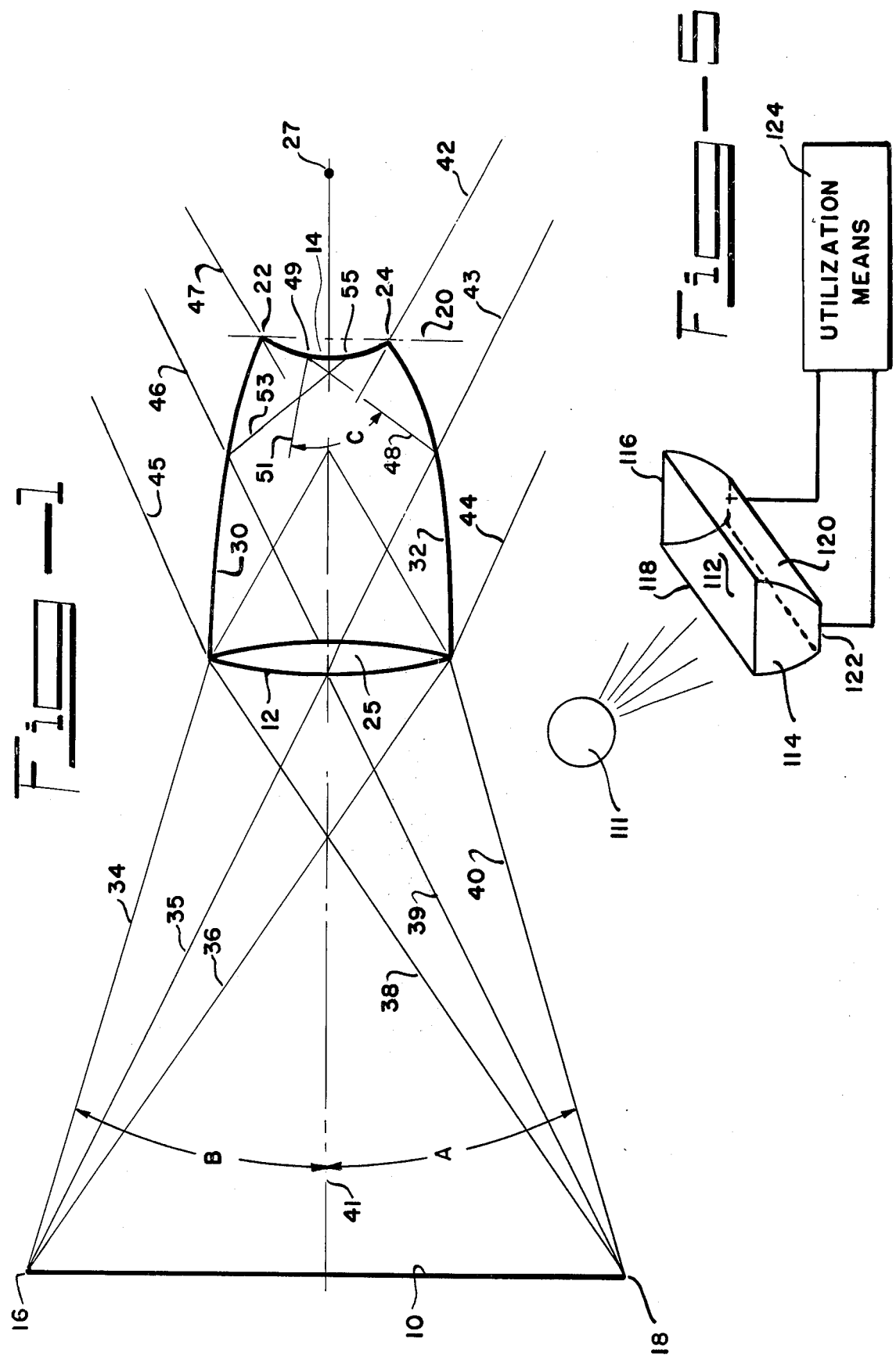

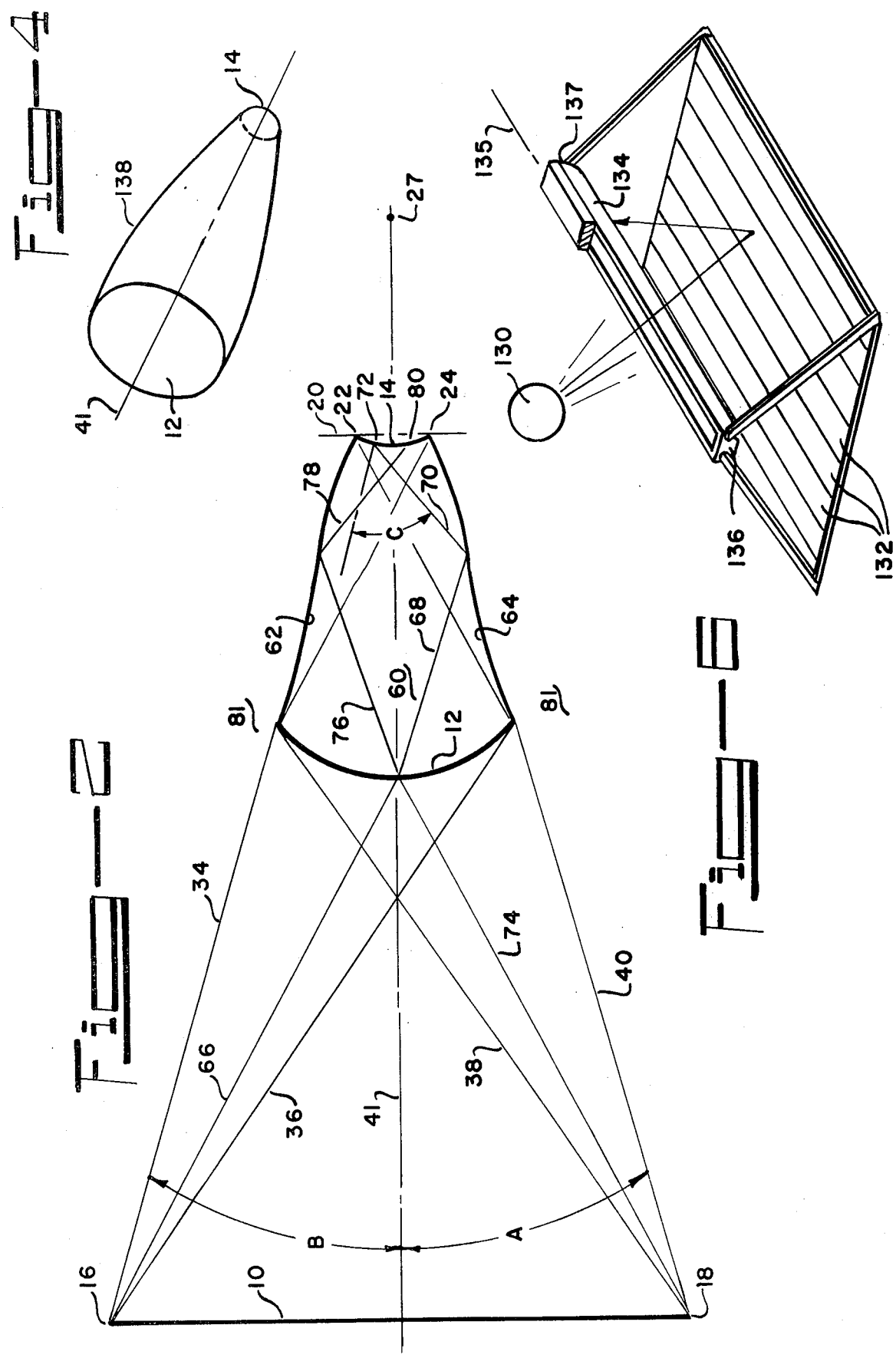

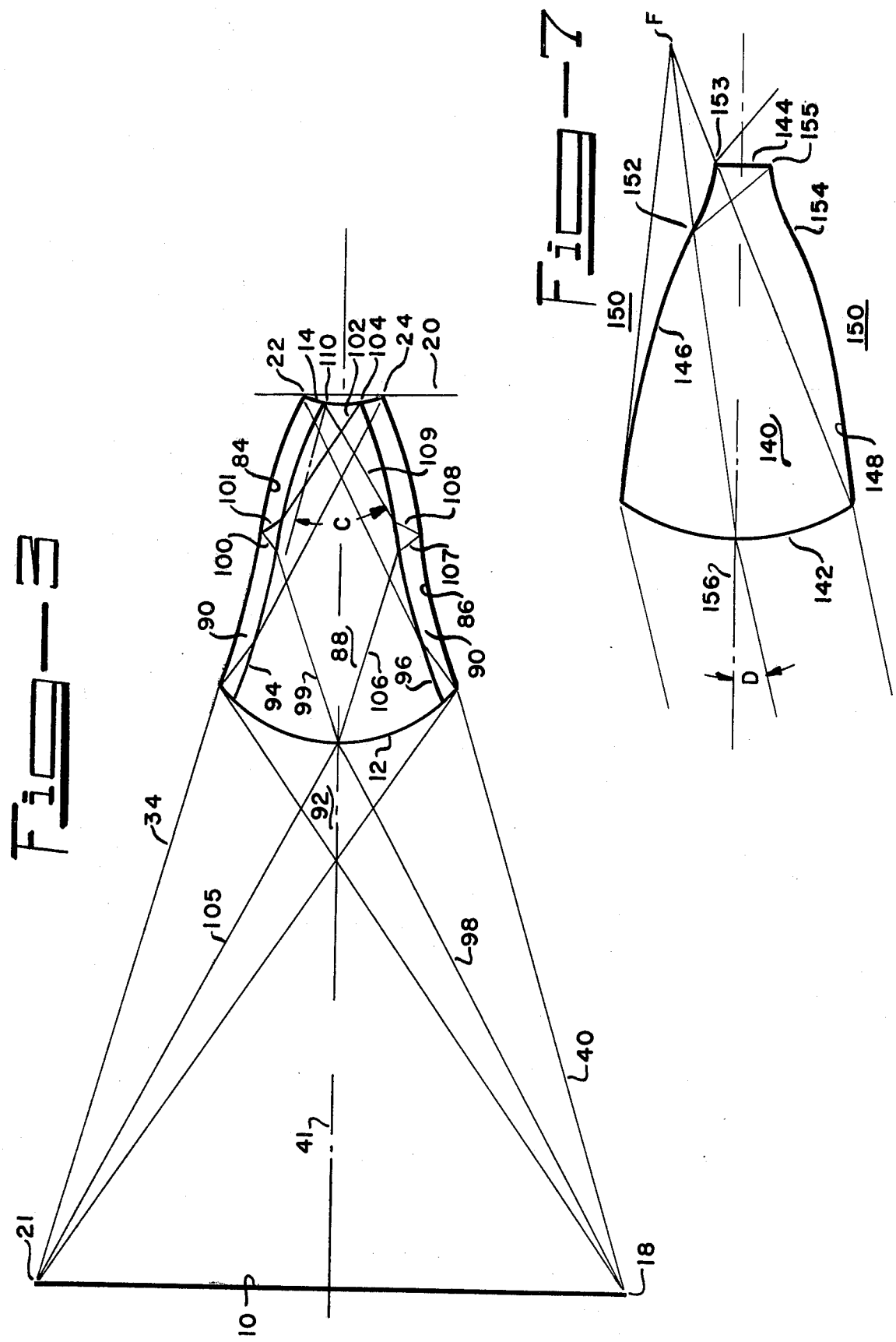

4,114,592

CYLINDRICAL RADIANT ENERGY DIRECTION DEVICE WITH REFRACTIVE MEDIUM

CONTRACTUAL ORIGIN OF THE INVENTION

The invention described herein was made in the course of, or under, a contract with the U.S. ENERGY RESEARCH AND DEVELOPMENT ADMINISTRATION.

BACKGROUND OF THE INVENTION

The present invention relates generally to radiant energy transmission devices, and in particular, to transmission devices having opposing reflective side walls operable in the concentrative mode whereby energy incident on an entrance area is directed to and concentrated on an exit area of smaller area than the entrance area. In a publication, *Solar Energy*, Vol. 16, No. 2, pages 89–95 (1974), in U.S. Pat. Nos. 3,923,381, 3,957,031 and 4,002,499 of Winston and in prior application Ser. No. 663,590, filed Mar. 3, 1976, there are described techniques for generating the ideal side wall contour for such a collector or transmission device. In a subsequent publication, *Applied Optics*, Vol. 15, No. 2, pages 291–292, Feb. 1976, there is described the application of the principles disclosed in the above art relating to ideal reflective side wall contour to transmitting and guiding surfaces at the interface of homogeneous media of differing indices of refraction for radiant energy. To the extent these items contain "essential material" necessary to support the claims hereof or indicate background, they are expressly incorporated by reference herein.

The devices employing these principles cited in the above art characterized by the side wall contour being determined by the definition that extremal rays incident on the wall are directed to be incident on the exit surface at a predetermined angle which is equal to or less than 90 degrees. In all these cases, however, all extremal rays are equally refracted between their passage between the entrance aperture, the side walls and the exit aperture. No consideration was given in the above to unequal refraction of extremal rays.

For certain concentrations, the prior art devices tend to have relatively high side walls with respect to the entrance area. Since side wall length contributes greatly to the cost of the device, the prior art technique for reducing side wall length is to truncate the device and simply do without the upper portions of the ideal reflective side wall. This may be done since the upper portions do not contribute a major portion of the concentrating ability of such devices. However, for certain uses all concentration is desirable and a fully ideal device would be desirable. In addition, the solid dielectric medium having total internal reflection may become quite expensive due to the entire area of the collector between the reflecting side walls being of an expensive dielectric material. It is therefore an object of this invention to provide an improved radiant energy direction device.

Another object of this invention is to provide an improved radiant energy concentration and collection device.

Another object of this invention is to provide a solar collector having a refractive element and an ideally contoured reflective wall.

Another object of this invention is to provide a solid solar concentrator of simplified construction utilizing cheaper materials than prior art devices.

SUMMARY OF THE INVENTION

A radiant energy direction device is provided which includes a refractive element which unequally refracts incident extremal rays and a reflective side wall. The device is designed to direct energy between an entrance surface and an exit surface wherein the exit surface is of smaller size than the entrance surface. Energy incident on the entrance surface is refracted before being incident on the reflective side wall which then directs the incident energy to the exit surface.

BRIEF DESCRIPTION OF THE DRAWINGS

FIG. 1 shows a transverse cross section of a radiant energy direction device combining a lens and a reflective wall;

FIG. 2 shows another embodiment of the radiant energy direction device combining a nonplanar entrance surface, a refractive media and a reflective wall;

FIG. 3 shows another embodiment of the energy device combining a nonhomogeneous refractive media and a reflective wall;

FIG. 4 shows a cone-shaped device utilizing the principles of FIG. 1, FIG. 2, FIG. 3 and FIG. 7;

FIG. 5 shows a trough-shaped structure as utilized as a primary solar energy collector;

FIG. 6 shows a trough-shaped structure as utilized as a secondary collector; and FIG. 7 shows an embodiment of the device utilizing total internal reflection.

DETAILED DESCRIPTION OF THE PREFERRED EMBODIMENT

Referring to FIG. 1, FIG. 2, FIG. 3 and FIG. 7, there are shown the transverse cross sections of cylindrical electromagnetic energy direction devices. As the disclosed device is a cylindrical direction device, the physical structure of the device is formed by extending the cross section shown along an axis perpendicular to the plane of the cross section to form a trough-like structure, as will be described with reference to FIG. 5 and FIG. 6. Note that for one particular species of the devices shown, namely the species wherein the exit surface is flat, the cross sections shown may also be rotated about an axis through the flat exit surface to form the cone-like structure in FIG. 4.

The function of a device when used as a concentration and collection device for radiant energy is to concentrate radiant energy from source 10 which impinge on entrance surface 12 onto an exit surface 14. There may be positioned at exit surface 14 an energy absorber when the device is used as a concentration device or an energy transmitter when the device is used as an energy transmission device. Where an energy absorber is used, it may be, for example, a pipe containing fluid, a photovoltaic cell or any other type of energy receiver responsive to radiant energy. Source 10 may be defined by edge points 16 and 18.

The present disclosure deals with developing the contour of side walls for reflecting energy incident on the side walls onto surface 14 which lies between axis 20 and source 10. The surface 14 is limited to being convex so that any line tangent to any point on surface 14 does not cross surface 14. Note that a convex surface 14 includes within its definition a flat planar surface which extends along axis 20. Axis 20 is a line connecting edge points 22 and 24 of exit surface 14. Edge points 22 and 24 are at the intersection of exit surface 14 with axis 20.

Referring to FIG. 1, there is positioned at the entrance surface 12 a lens 25. A lens is a device which converges or diverges incident energy such that an envelope of parallel rays of energy will tend to be concentrated at or diverged from a particular point, the focus. In the embodiment shown in FIG. 1, lens 25 is converging, i.e. it has a focus 27 which permits energy from source 10 to reach the opposing reflective side walls 30 and 32. A typical lens 25, for example, would be a Fresnel lens.

Lenses are, generally speaking, not perfect optical devices and have aberrations. From the present point of view of designing ideal radiation concentrators, all aberrations in the transverse plane (or meridional plane), other than chromatic aberrations, are corrected out, or compensated for by appropriately shaping the reflecting side walls. Therefore, since aberrations do not intrinsically limit the performance of the total design, we may, for the sake of clarity, idealize lens performance characteristics by referring to point foci and point images with the understanding that the actual shape of the reflecting side wall is designed for the properties of the actual lens employed together with its aberrations.

The outer surface of lens 25 coincides with entrance surface 12. Consider the operation of lens 25 upon extremal rays where lens 25 converges such rays to a point. For a source 10 of finite distance from the collector, the extremal rays are generated from the conjugate edge point of source 10 to each side wall 30 and 32. Thus the angle each extremal ray, such as rays 34, 35, 36, 38, 39, and 40, makes with a reference axis 41 passing through surface 14 varies. However, as the distance from the source 10 to the collector approaches infinity, these extremal rays become parallel and the angle each makes with axis 41 are equal. In designing a primary solar collector, the sun is generally assumed to be an infinitely distant source while for a secondary collector the primary collector is treated as a finite source. The term extremal ray is used to denote rays from conjugate edge points of a source of finite distance from the collector or the assumed parallel extremal rays from a source of infinite distance from the collector (e.g. the conjugate edge points are two positions of the sun). These ray are used to determine the ideal contour for the side walls, and in either the finite or infinite case there will be only one extremal ray from which each point of the side wall contour is determined.

Rays 34, 35, 36, 38, 39 and 40 incident on the entrance surface 12 and thereby the lens 25, after having passed through the lens, are refracted and tend to converge along ray 42, 43, 44, and 45, 46, and 47. Side walls 30 and 32 are contoured so that all energy incident on surface 12, and thereby lens 25, within a given acceptable angle is directed to surface 14, after having been refracted by lens 25. For a light source of finite distance from the collector, the acceptance angle A and B for each wall 30 or 32, respectively, is determined by the extremal ray from an edge point 16 or 18, refracted by lens 25, and incident on the conjugate point 22 or 24, i.e. lines 34 and 42 and 40 and 47. The angle of incidence at the points 22 and 24 is a predetermined value equal to or less than $\pi/2$. If $\pi/2$ is chosen for each side of axis 41, then lines 42 and 47 are tangent to surface 14. For a source of infinite distance from the collector, all extremal rays are considered parallel and the angles A and B are arbitrarily selected by the designer. In any event, each extremal ray, be it the parallel rays from the infinite source or the nonparallel rays from the edge points of the finite source, after having been refracted, is then directed by each side wall 30 and 32 to the exit surface 14. The ideal contour of each side wall 30 and 32 is determined by the rule that extremal rays incident thereupon are then directed to be incident on surface 14 at a particular angle C. This angle C is equal to or less than 90 degrees in accordance with the principles of restricted exit angle defined in the pending application, Ser. No. 663,590, previously referred to. Therefore, wall 32 directs incident ray 35 along path 48 to be incident on surface 14 at point 49 at angle C with respect to line 51 which is normal to surface 14 at point 49. Wall 30 directs incident ray 39 along path 53 to be incident on surface 14 at angle C at point 55. It can be seen that this device, with the lens being convergent, will have shorter side walls 30 and 32 than the combination having only the reflective wall, since the lens clusters all extremal rays rather than lets them travel unbent or bent equally as in the prior art references.

This design bestows upon the shape of the side walls the maximum possible slope consistent with the condition that the extremal rays be incident on the exit surface 14 at the prescribed angle C. This design prescription gives maximally concentrating structures which produce maximal concentration for a given overall length subject to various conditions imposed such as the geometry of the source, the entrance surface, the exit surface and the maximum angle of incidence C.

Referring to FIG. 2, there is shown another embodiment of the device. Here, the refractive element is a homogeneous material 60 disposed between entrance surface 12 and exit surface 14 and between reflective side walls 62 and 64. To provide convergent refraction, surface 12 and the portion of material 60 coincident with surface 12 is curved convexly with respect to material 60. This curvature allows material 60 to act on rays incident within angles A and B in the same manner as lens 25 of FIG. 1. Here again walls 62 and 64 are contoured to direct all extremal rays to be incident on surface 14 at the angle C. Thus ray 66 is refracted along path 68 by material 60 and is then directed by wall 64 along path 70 to be incident on surface 14 at angle C at point 72. Ray 74 is refracted along path 76 by material 60 and then is directed by wall 62 along path 78 to be incident on surface 14 at angle C at point 80.

In FIG. 2 where surface 12 is linear rather than convex, material 60 could be a nonhomogeneous material having a gradient of index of refraction. Thus rays 68, 70, 76 and 78 would not be straight but would be curved according to the gradient. Preferably to provide reduced side wall dimensions, the gradient would be in the direction of the higher index values along axis 41 and the index falling off as one departs from the axis 41. In any event, side wall contour is still determined by tracing the path of extremal rays to the side wall and then directing them to be incident on surface 14 at angle C. Note, however, that after being reflected by the side walls the rays may be further refracted so that the side wall contour must take this into account.

The reason that refractive-reflective structures obeying the extremal ray design principle already enunciated function as maximal concentration devices can be seen by introducing the optical path length for the bundle of extremal rays.

$$W(\vec{r_1}, \vec{r_2}) = \int_{r_1}^{r_2} n \vec{k} \cdot \vec{dl} \quad (1)$$

Here $n$ is the index of refraction, which may vary along the path and $k$ is the ray direction. We take the point $r_1$ to be on the edge of source 10 (say point 16 in FIG. 1) and $r_2$ to be on the exit surface 14 (say point 49 in FIG. 1). The design prescription is to shape the side wall (say wall 32 in FIG. 1) to have the maximum slope consistent with reflecting the extreme ray onto the exit surface 14 at angle of incidence C. Then, introducing the arc length S along the exit surface we have $$\frac{dW}{ds} = n \vec{k} \cdot \frac{\vec{dl}}{ds} = n \sin C \quad (2)$$

where C is the angle of incidence of the extreme ray on the exit surface. Therefore $$\Delta W = \int n \sin C \, ds \quad (3)$$

which corresponds to maximal concentration consistent with the specified maximum angle of incidence C on the exit surface. Notice that C can be a function of S across the exit surface, where S is the total arc length, and, in fact, can have asymmetric positive and negative values ($-C'$, $+C''$) if desired. Note that W is optical path length.

To illustrate the content of relation (3), we consider the configuration of FIG. 2 with medium 60 of constant index $n$, external medium 81 of index 1, and constant angle of incidence C on exit surface 14. For simplicity we take source and collector symmetrically disposed with respect to axis 41. Then $$\Delta W = n(\sin C)S \quad (4)$$

However, $$\Delta W = (1_{38} - 1_{40}) \quad (5)$$

where 1 is the distance from edge of source 10 to the edge points of entrance surface 12. Therefore $$S = (1_{38} - 1_{40})/(n \sin C)$$

which we recognize as maximal concentration consistent with the chosen subsidiary conditions.

The side walls of the embodiment of FIG. 1 are made reflective by being of a reflective material such as aluminum or silver. The side walls of the embodiment of FIG. 2 can also be of a reflective material coated onto the homogeneous medium 60 or a solid reflective material containing medium 60. In addition, the boundary between medium 60 and the external environment 81 in FIG. 2 can be such that all extremal rays are reflected by total internal reflection at the boundary in accordance with the teachings of the Applied Optics article. In FIG. 1 there could be placed a dielectric medium between the walls 30 and 32 which could have a reflective material forming walls 30 and 32 or exhibit total internal reflection.

Referring to FIG. 3, there is shown another embodiment of the device. In FIG. 3, the refractive element is a composite of homogeneous materials of differing indices of refraction disposed between the entrance surface 12 and the exit surface 14 and between the reflective side walls 84 and 86. In FIG. 3 there are shown two media 88 and 90 but there could be an infinite number. Energy incident on refractive medium 88 will be bent at the interface first between the media 88 and the outside environment 92 and then at the interfaces 94 and 96 between media 88 and media 90. So long as the interfaces 94 and 96 are smoothly curved, or the exit surface is curved, rays will be converged or diverged as with lens 25 of FIG. 1. Side wall contours 84 and 86 are then determined according to the same principles with respect to energy ultimately incident on surface 14 as described with respect to FIG. 1 and FIG. 2. Ray 98 will be bent along path 99 by media 88, along path 100 by media 90, along path 101 by wall 84 to be incident, after being bent along path 102 by media 88, on surface 14 at angle C at point 104. Ray 105 will be bent along path 106 by media 88, along path 107 by media 90, along path 108 by wall 86 to be incident, after being bent along path 109 by media 88, on surface 14 at angle C, at point 110.

The advantage of this particular embodiment is that for the solid dielectric medium having total internal reflection, as referred to with respect to FIG. 1 and FIG. 2 and as described in the *Applied Optics* publication previously referred to, the entire area between walls 84 and 86 had to be of a homogeneous dielectric material. Such material may be relatively expensive when compared to the material which may be substituted in the center for medium 88. The device is also smaller because the walls are shorter. Thus, media 88 might be, for example, water which is relatively cheap compared to plastic, and only media 90 need be of an expensive plastic material such as acrylic.

In FIG. 1 and with a homogeneous media 60, FIG. 2, with surface 14 planar and extending along axis 20, and angle C = 90°, the contour of each side wall reduces to a hyperbola with foci at the point image of the extremal rays produced by lens 25 or media 60 and at the opposite edge point of surface 14. Thus, in FIG. 1, the foci for hyperbolic wall 30 are the image of point 18 and point 24 whereas for wall 32 the foci are the image of point 16 and point 22. This assumes that lens 25 is perfect for off-axis rays which is unrealistic. In addition, with a planar surface 14, the ideal wall contour 138 may be rotated about axis 41 to form a cone-shaped structure as illustrated in FIG. 4.

As previously referred to, the general design prescription allows us to specify for any of the embodiments herein disclosed that the reflection at the side wall be by total internal reflection. To accomplish this we use the teaching of the *Applied Optics* publication already referred to wherein we state that the profile curve of the dielectric media is generated by allowing the profile curve of the external wall to take on the maximum possible slope consistent with totally internally reflecting the extremal rays onto the exit surface. An example of the implementation of this design prescription is illustrated in FIG. 7 where the dielectric medium 140 has curved entrance surface 142 which acts as a lens. For simplicity, we consider concentrating energy emanating from an infinitely distant source (maximum angle D) onto a flat exit area 144. Moreover, we idealize the performance of the lens as imaging the extremal rays (angle D) onto F. The side walls 146 and 148, which are the interface between the internal medium 140 of refractive index $n_1$ and the external medium 150 of lesser refractive index $n_2$ is capable of totally reflecting internal rays provided their angle of incidence on the wall 146 or 148 exceeds the critical angle $$\theta_c = \arc\sin(n_2/n_1)$$

If the wall were a specular reflector for all angles and the desired angle C = 90°, the entire curve of each wall would be a hyperbola. However, we find that the portion of the hyperbola between points 152 and 153 at the edge of the exit surface 144 and points 154 and 155 at the edge of exit surface 144 would have angles of incidence on the side wall of less than $\theta_c$ and would allow energy to leak out. That is, it is impossible to have a side wall contour between points 152 and 154 and exit surface 144 which directs by total internal reflection all incident extremal rays to be incident on exit surface 144 at the desired exit angle C. Points 152 and 154 are transition points along the contour where the angle of incidence of extremal rays equals $\theta_c$. Therefore, in conformity with the maximum slope prescription, the best we can do is to maintain the angles of incidence of the extremal rays incident on the side walls at $\theta_c$ in the portion between points 152 and 153 and points 154 and 155. Therefore, this portion of the profile curve is no longer a equiangular spiral.

An example of the practical application of the principles herein disclosed is shown in FIG. 5. Here the collector disclosed is used as a primary collector. The collector is used to collect and concentrate energy from the sun 111. The collector 112 has a transverse cross section which is extended along an axis perpendicular to the cross section shown in FIG. 1, FIG. 2, FIG. 3 and FIG. 7 to form a trough-like cylindrical collector. Flat reflective end walls 114 and 116 fully enclose the collector 112. Concentrating walls 118 and 120, whose contours are generated as described with reference to FIG. 1, FIG. 2, FIG. 3 and FIG. 7, and side walls 114 and 116 have a reflective capability such as by being of aluminum or silver, or being totally internally reflecting. The reflected energy is directed by these reflecting walls onto the exit surface at which in this embodiment there is poitioned a planar energy receiver 122, such as a photovoltaic cell. Connections are provided to the receiver 122 to allow utilization of the energy absorbed thereby by utilization means 124.

Another example of a practical embodiment is shown in FIG. 6. Here the collector is used as a secondary collector. Energy from the sun 130 is initially collected by primary collector 132 which might be an array of mirrors. The energy incident on collector 132 is directed to secondary collector 134 which has a transverse cross section developed with respect to the edge points of primary source 132 and which is generated along axis 135 perpendicular to the cross section to form the trough-like cylindrical collector. End walls 136 and 137 fully enclose the collector.

While the invention has been described in detail as a collector and concentrator of energy and with an energy receiver, it is not limited to this form. Any electromagnetic energy transducer, receiver or transmitter can be used. Thus, if it is desired to transmit energy over a particular angle, an energy radiator could be substituted for the energy receiver.

The designs have been described in a two-dimensional (transverse plane) of the collector. For trough collectors, this is adequate for all reflecting structures. However, as is well known, cylindrical lenses have aberrations for rays out of the transverse (meridional) plane. The effect is to shorten the focal length when the rays have components out of the plane. We have found both by calculation and by experiment that the effect does not seriously deteriorate off-plane performance for trough lens-mirror concentrators and has no perceptible effect on cone-like lens-mirror concentrators.

As with the other design prescriptions in the references cited, in speaking of the limiting case for convex exit surface, namely the flat exit surface, the solution is taken as the mathematical limit of the convex solution. For flat exit surfaces the solution is determined by maximizing the wall slope consistent with reflecting or totally internally reflecting the extremal rays onto the exit surface at angle of incidence which does not exceed the predetermined angle C as described in the Ser. No. 663,590 application referred to above.

The embodiments of the invention in which an exclusive property or privilege is claimed are defined as follows:

1. A device for collecting and concentrating solar energy incident on an entrance onto the surface of an energy absorber where said absorber surface is of less area than said entrance surface, the entrance surface being on a first side of a first reference axis, the absorber surface having a cross section bounded by and which is convex with respect to the first reference axis on said first side of said first reference axis, the absorber surface having a second reference axis extending therethrough perpendicular to said first reference axis, the perimeter of the cross section of the absorber surface extending from a first edge point along the first reference axis to a second edge point along the first reference axis, comprising:

a refractive element and a first reflective boundary, said boundary and said element being positioned on said first side of said first reference axis between the absorber and entrance surface such that extremal rays from a source of solar energy incident on the entrance surface at an angle with respect to said second reference axis equal to or less than a predetermined value are refracted unequally by said refractive element, said first reflective boundary being of such contour that the slope of any point along said contour is the maximum slope consistent with achieving reflection of any extremal ray of energy incident on said entrance surface and then refracted and incident on said point of said boundary along a line which intersects the perimeter of the cross section of the absorber surface at an angle not exceeding a particular value C where C is less than or equal to 90°, said reflective boundary extending from said first edge point of said absorber to no further than an intersection with said entrance surface, said boundary and said absorber being parallel to a third reference axis perpendicular to said first and second reference axis to form a trough-shaped device.

2. The device of claim 1 wherein said refractive medium develops a point image of extremal ray, said absorber surface is flat and extends along said first reference axis, C equals 90° and said reflective boundary is a specular reflector, the contour of said first boundary thereby being in the form of a portion of a hyperbola with foci at the point image of said extremal rays and said second edge point of said absorber surface.

3. The device of claim 1 further including a second reflective boundary positioned on said first side of said first reference axis subtantially opposite said first reflective boundary and between said absorber and entrance surfaces and extending parallel to said third reference axis, said second reflective boundary being of such contour that the slope of any point along said contour is the maximum slope consistent with achieving maximum reflection of any extremal ray of energy incident on said entrance surface and then refracted and incident on said point of said boundary which is then reflected along a line which intersects the perimeter of the cross section of the absorber surface at said particular angle C, said second reflective boundary extending from said second edge point of said absorber surface to no further than an intersection with said entrance surface.

4. The device of claim 3 wherein each reflective boundary extends to said entrance surface.

5. The device of claim 4 wherein said refractive element is a lens one face of which coincides with said entrance surface and the other side of which lies between said entrance and absorber surfaces.

6. The device of claim 4 wherein said refractive element is a dielectric media disposed between said entrance and absorber surfaces and said reflective boundaries.

7. The device of claim 6 wherein said media is a homogeneous media.

8. The device of claim 6 wherein said media is a non-homogeneous media.

9. The device of claim 8 wherein said entrance urface is linear and said nonhomogeneous media has a gradient of index of refraction with higher values along said second reference axis falling off away from said second reference axis.

10. The device of claim 6 wherein said media is a composite of a plurality of media.

11. The device of claim 10 wherein each of said media is homogeneous and said media are symmetrically disposed on either side of said second reference axis.

12. The device of claim 4 wherein said reflective boundaries are formed at the interface between media of differing indices of refraction and reflecting of rays by said boundaries is by total internal reflection.

13. The device of claim 12 wherein a homogeneous media is disposed between said reflective boundaaries and said absorber and entrance surface which develop a point image of extremal rays, the refractive index of said media being greater than that of the external media on the other side of said boundaries from said homogeneous media, said absorber surface is flat, extending along said first reference axis, and all extremal rays make an angle with said second reference axis equal to said predetermined value, said reflective boundaries thereby each having two portions, a first portion of each boundary is in the form of a hyperbola with foci at point image and at the opposite edge point of said absorber surface from said boundary, said first portion extending from said entrance surface towards said absorber surface to a transition point, said transition point being the point wherein the extremal ray is incident thereon at an angle equal to the critical angle for total internal reflection for the interface between said homogeneous media and said external media, the second portion of each boundary extending from said transition point to the edge point of said absorber surface on the same side of said second reference axis as said boundary and is in the form of an equiangular spiral.

14. The device of claim 4 wherein said extremal rays are from the sun and said device is utilized as a primary solar energy concentration and collection device.

15. The device of claim 4 wherein said extremal rays are from a finite source in the form of a primary solar energy collection device and said device is utilized as a secondary collector.

* * * * *